(12) United States Patent
Kashima et al.

(10) Patent No.: US 6,814,609 B2
(45) Date of Patent: Nov. 9, 2004

(54) ELECTRICAL SIGNAL READ-OUT METHOD AND DEVICE THEREFOR

(75) Inventors: Isao Kashima, Tokyo (JP); Rumiko Kashima, Tokyo (JP)

(73) Assignee: Mechano Electronics, Inc. (JP)

( * ) Notice: Subject to any disclaimer, the term of this patent is extended or adjusted under 35 U.S.C. 154(b) by 0 days.

(21) Appl. No.: 10/324,399

(22) Filed: Dec. 20, 2002

(65) Prior Publication Data

US 2003/0143889 A1 Jul. 31, 2003

(30) Foreign Application Priority Data

Dec. 20, 2001 (JP) ........................................ 2001-388324

(51) Int. Cl.[7] .............................................. H01R 11/18
(52) U.S. Cl. ..................................... 439/482; 439/725
(58) Field of Search .......................... 439/70, 482, 912, 439/729, 725, 837

(56) References Cited

U.S. PATENT DOCUMENTS 4,671,592 A * 6/1987 Ignasiak et al. ............ 439/331

FOREIGN PATENT DOCUMENTS

SU          1005-227 A  * 12/1981

* cited by examiner

*Primary Examiner*—Phuong Dinh
(74) *Attorney, Agent, or Firm*—Lerner, David, Littenberg, Krumholz & Mentlik, LLP

(57) ABSTRACT

An electric signal taking-out method and a device therefor capable of taking out electric signals for measurement easily from opposite ends of an arbitrary chip part soldered to a circuit board. A pair of contact elements having sharp distal ends and bent obliquely inward are arranged so that the distal ends thereof face each other. The contact elements are shifted inward by a holding member so that the distal ends bite into solder joints by which the chip part is soldered to the circuit board. The contact elements are held in the biting state so that electric signals are taken out independently from the respective contact elements.

7 Claims, 5 Drawing Sheets

ELECTRICAL SIGNAL READ-OUT METHOD AND DEVICE THEREFOR

BACKGROUND OF THE INVENTION

1. Field of the Invention

The present invention relates to an electric signal taking-out method and a device therefor, which are used for taking out an electric signal or signals for measurement from an arbitrary place of a circuit board mounted to electronic/electric equipment when the equipment is checked, adjusted or repaired.

2. Description of the Related Art

A small electronic part which is mounted on a printed circuit board and is referred to as a chip part, such as a resistor, capacitor or the like, is formed to have an extremely small rectangular parallelepiped configuration which has a length of 0.3 to 1.25 mm, a width of 0.2 to 0.6 mm and a height of 0.25 to 0.6 mm. A circuit board is constructed so that such chip parts are mounted onto a circuit pattern formed on a front surface and/or a back surface of the circuit board by soldering. When a chip part is soldered to the surface of the circuit board, solder rises from the surface of the circuit board to an upper surface edge of the chip part in such a manner as to form an inclined surface on the solder affixed to each of opposite end surfaces of the chip part.

In the case where a signal line on the circuit board during development or on the circuit board completed as a product is checked, it is necessary to take out an electric signal or signals for measurement from the solder joints of the chip parts and feed it/them to a measuring apparatus. Conventionally, in order to take out an electric signal or signals for measurement from the circuit board which has chip parts soldered thereto as mentioned above, tweezers having two arms insulated from each other are held by a user's fingers, and the two arms are pressed so that distal end electrodes thereof are pressedly brought into contact with the solder joints at the opposite ends of the chip part. In this state, while the tweezers are being held, an electric signal or signals is/are taken out so as to be checked by the measuring apparatus.

In another conventional technique, metal pieces or chips with a hole, which are adapted to be clamped or caught by a commonly used clip, probe or the like, are previously soldered to side surfaces of an electronic part, and ends of the metal chips rising from an upper surface of the circuit board are clamped by the clip, probe or the like, as desired, whereby an electric signal or signals is/are taken out so as to be output to the measuring apparatus. Such a metal chip is formed to have approximately the same size as that of the electronic part, and the metal chip as well as the chip part are soldered to the circuit board while the metal chip is kept in contact with the end of the chip part.

In the former conventional technique of bringing the end electrodes into contact with the chip part, when the user's hand is taken off the tweezers, the electrodes are disengaged from the electronic part, and thus pressing of the tweezers should be continued during the measurement. For this reason, in the case of measurement requiring a long time, there arises a problem that work efficiency is very low. Moreover, even if both hands are used, electric signals in only two places can be taken out, that is, electric signals cannot be taken out arbitrarily from many places. Therefore, an analysis of multi-signals simultaneously taken out cannot be made by using an electronic measuring apparatus of a multi-signal simultaneous analysis type, such as a logic analyzer or the like.

Further, in the latter conventional technique of soldering the metal chip for a clip to the side surface of the electronic part, the material cost and the man-hour cost rise. Moreover, although a number of such electronic parts referred to as chip parts are used in a variety of recent small electronic equipment, metal chips for measurement cannot be mounted to all the mounted chip parts, and thus electric signals cannot be taken out from arbitrary places. Moreover, since a chip part has been further miniaturized and chip density on a circuit board has become high recently, it is difficult to provide a space for mounting metal chips for measurement on the circuit board, so that arrangement of metal chips for measurement cannot be effected.

The present invention has been made in order to solve the above mentioned problems of the conventional techniques. Accordingly, an object of the present invention is to provide an electric signal taking-out method and a device therefor which are capable of easily taking out an electric signal or signals for measurement from opposite ends of an arbitrary chip part soldered to a circuit board without a user's hand having to hold tweezers during measurement or without previously soldering metal chips or the like for measurement to an electronic part.

SUMMARY OF THE INVENTION

According to one aspect of the present invention, an electric signal taking-out method is provided. The method includes the steps of: arranging a pair of contact elements which include sharp distal ends and are bent obliquely inward so as to be opposite to each other so that the sharp distal ends face each other; shifting the pair of contact elements inward so as to make the sharp distal ends thereof bite into solder joints by which a chip part is soldered to a circuit board; and holding the pair of contact elements in a biting state, to thereby take out electric signals independently from the pair of contact elements.

According to another aspect of the present invention, an electric signal taking-out device is provided. The device includes: a pair of contact elements made of an electrically conductive material, each including a distal end portion which is bent obliquely inward and which has a sharp distal end, the pair of contact elements being arranged in such a manner as to be electrically insulated from each other and to be opposite each other while the sharp distal ends thereof face each other; and a holding member for drawing the pair of contact elements toward each other so as to press the distal ends of the contact elements onto an object to be measured, to thereby make the distal ends of the contact elements bite into the object, and holding the pair of contact elements in a state where the distal ends of the pair of contact elements are biting into the object.

In a preferred embodiment of the present invention, the device further includes a supporting member having the pair of contact elements mounted thereto and provided with a guide section; wherein the holding member is slidably fitted on the guide section of the supporting member so as to be moved between a first position and a second position, whereby when the holding member is located in the first position, a spacing between the distal ends of the pair of contact elements becomes large, and when the holding member is located in the second position, the spacing between the distal ends of the pair of contact elements becomes small.

In a preferred embodiment of the present invention, the holding member is provided with a brake piece which is elastically engaged with the guide section of the supporting member so as to keep the holding member stopped at an arbitrary position with respect to the supporting member.

In a preferred embodiment of the present invention, the holding member has electric conductors led out to the outside and is provided on a distal end thereof with a pair of fixed pins which are formed of an electrically conductive material and which come in contact with outside surfaces of the pair of contact elements so as to shift the pair of contact elements inward, the fixed pins being connected with the electric conductors, respectively.

In a preferred embodiment of the present invention, the device further includes a spring, disposed between the supporting member and the holding member, for biasing the holding member toward the second position.

In a preferred embodiment of the present invention, the pair of contact elements include proximal portions which are formed integrally with the supporting member, and the supporting member has electrically conductive leads led out to the outside and connected with ends of the proximal portions of the contact elements, respectively.

In a preferred embodiment of the present invention, the supporting member includes an isolation piece extending between the pair of contact elements toward the distal ends of the contact elements so as to prevent the pair of contact elements from coming into contact with each other.

BRIEF DESCRIPTION OF THE DRAWINGS

FIGS. 6A through 6C are perspective views showing states where the electric signal taking-out device is mounted to chip parts of different sizes, wherein FIG. 6A shows the state where the device is mounted to a chip part of the minimum size, FIG. 6B shows the state where the device is mounted to a middle-sized chip part, and FIG. 6C shows the state where the device is mounted to a chip part of the maximum size; and FIGS. 7A through 7C are cross-sectional views showing an electric signal taking-out device according to another embodiment of the present invention, wherein FIG. 7A shows a normal state of the device, FIG. 7B shows a state where a holding member is moved to an uppermost position, and FIG. 7C shows a state where the device is mounted to a chip part.

DETAILED DESCRIPTION OF THE INVENTION

Figure 1:
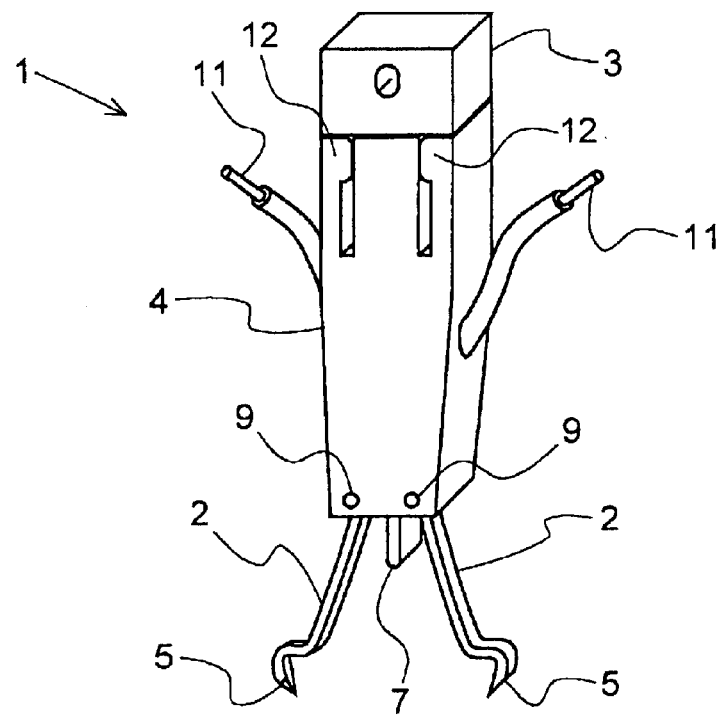
FIG. 1 is a perspective view showing an electric signal taking-out device according to an embodiment of the present invention.
Figure 2:
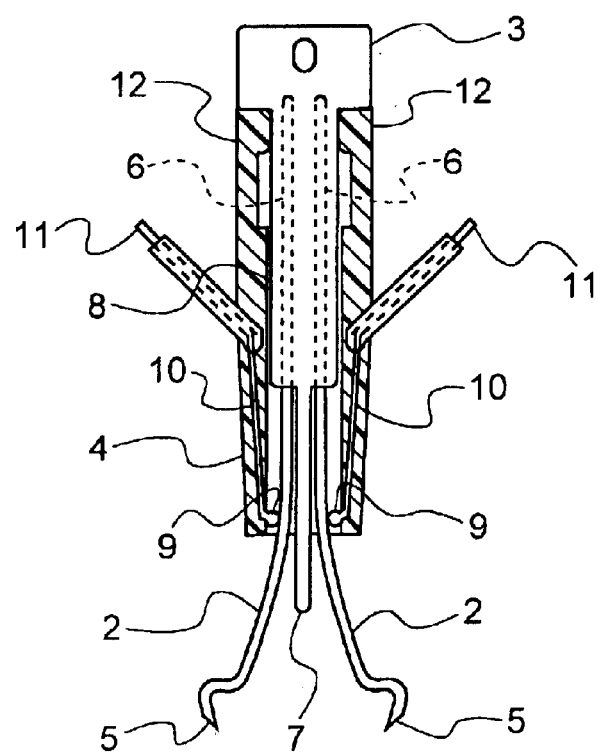
FIG. 2 is a cross-sectional view showing the electric signal taking-out device of FIG. 1.
Figure 3:
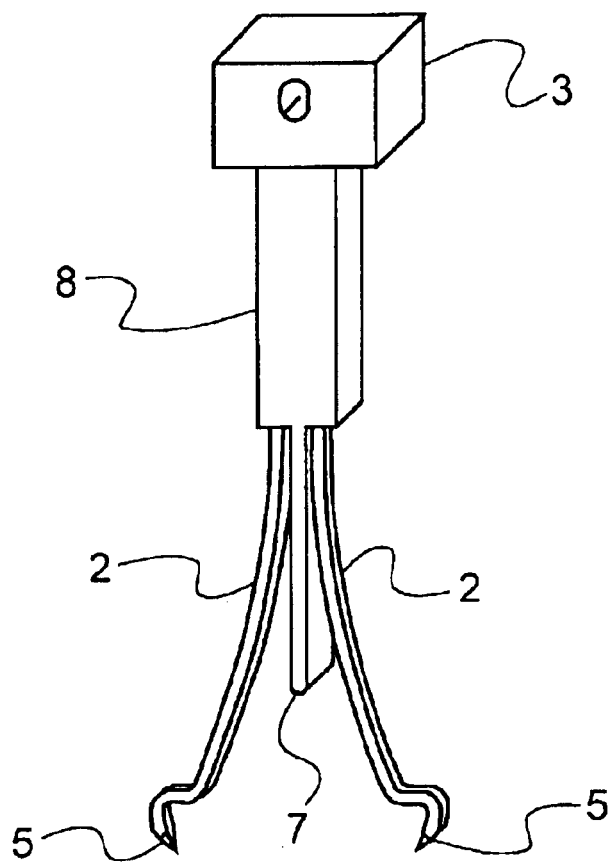
FIG. 3 is an exploded perspective view showing the electric signal taking-out device of FIG. 1.
Figure 3:
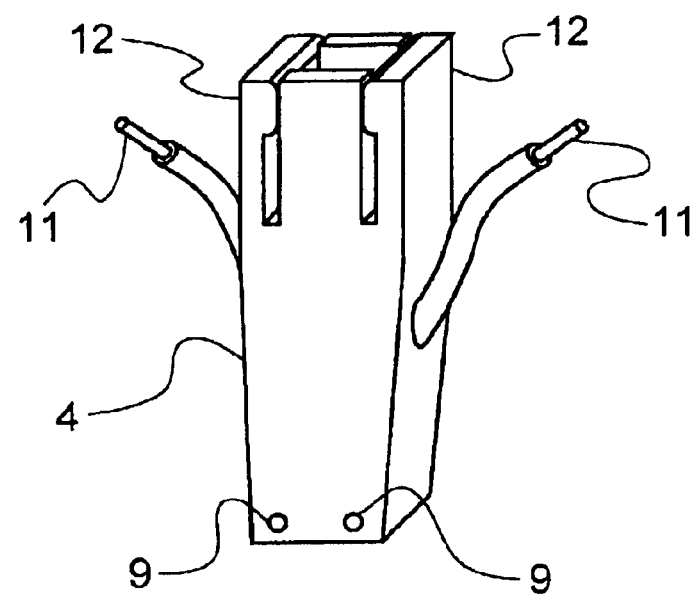

Embodiments of the present invention will be explained below with reference to the drawings. As shown in FIGS. 1 through 3, an electric signal taking-out device 1 according to an embodiment of the present invention is composed of a support member or holder 3 and a holding member 4. The holder 3 is provided with a pair of contact elements 2 protruded in a distal end direction. The holding member 4 is slidably fitted on an outer periphery of the holder 3. The contact elements 2 are formed of a high strength material having electrical conductivity such as stainless steel, and include distal end portions which have respective distal ends 5 formed to be sharp and bent inward so as to be faced in an obliquely downward direction. The pair of contact elements 2 are arranged to face each other so that the sharp distal ends 5 are opposed to each other and proximal portions 6 thereof are formed integrally with the holder 3 made of an insulating plastic material by insert molding or the like.

As shown in FIG. 2, the proximal portions 6 of the contact elements 2 are arranged apart from each other in the holder 3 so as to be insulated from each other, and the distal end portions of the contact elements 2 protruded from the holder 3 are previously formed so as to permit the sharp distal ends 5 to be widely spaced apart. An isolation piece 7 which is formed integrally with the holder 3 is disposed between exposed portions of the contact elements 2 protruded form the holder 3 so as to be extended in a distal end direction of the contact elements 2, thereby preventing the contact elements 2 from coming in contact with each other.

The holding member 4 is formed to have a square cylindrical shape so as to house a quadratic prism-shaped guide section 8 formed at a lower end of the holder 3 and is mounted to the holder 3 so as to be slidable along an outer peripheral surface of the guide section 8. The holding member 4 is provided at a lower end thereof with fixed pins 9 which come in contact with respective outside surfaces of the contact elements 2 and shift the contact elements 2, which will spread out, inward. The fixed pins 9 are formed of an electrically conductive material and, as shown in FIG. 2, are connected with respective electric conductors 10 which are embedded in side walls of the holding member 4 by molding so as to be connected with a measuring apparatus (not shown) via electrically conducting leads 11 which are connected with upper ends of the electric conductors 10 and led out to the outside.

The holding member 4 is formed at the upper end thereof with brake pieces 12 for applying resistance to sliding movement of the holding member 4. The brake pieces 12 are constructed by the upper ends of the side walls of the holding member 4 which elastically abut against the outer side surfaces of the quadratic prism-shaped guide section 8 of the holder 3 so that sliding resistance is generated between the holding member 4 and the holder 3, resulting in the sliding resistance keeping the holding member 4 stopped at an arbitrary position with respect to the holder 3.

Figure 4:
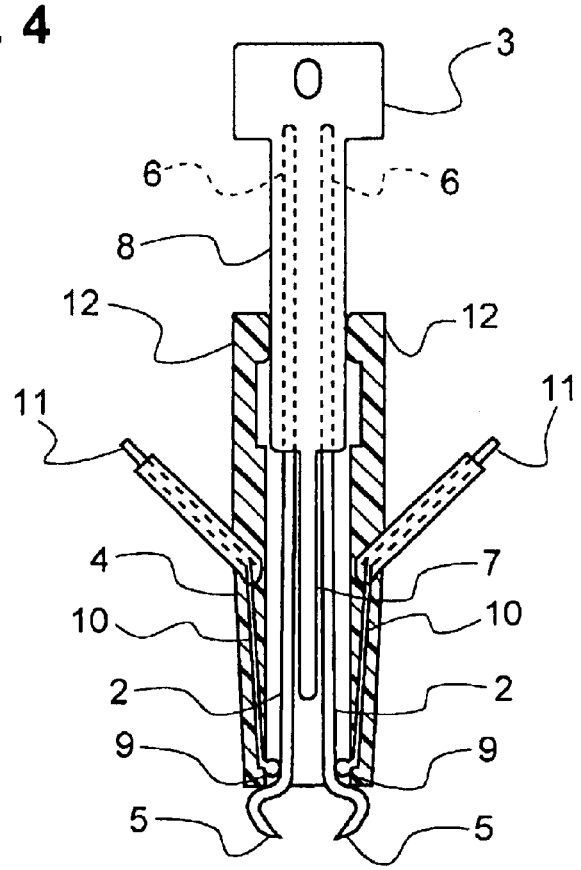
FIG. 4 is a cross-sectional view showing the electric signal taking-out device of FIG. 1 in a state where a holding member is moved to a lowermost position.

As shown in FIG. 2, in the state where holding member 4 is located at an upper position relative to the holder 3, the fixed pins 9 come in contact with portions of the contact elements 2 close to the proximal portions 6, whereby the distal ends 5 of the contact elements 2 are arranged so as to be greatly spread apart due to the elasticity of the material forming the contact elements 2. As shown in FIG. 4, when the holding member 4 is slid downward with respect to the holder 3, the fixed pins 9 come in contact with portions of the contact elements 2 close to the distal ends 5 of the contact elements 2 so as to shift the contact elements 2 in an inwardly drawn state. The dimensions of the contact elements 2 are set so that the spacing between the distal ends 5 thereof becomes the same as a dimension of a chip part having the minimum size in the state where the holding member 4 is moved to the lowermost position.

Figure 5:
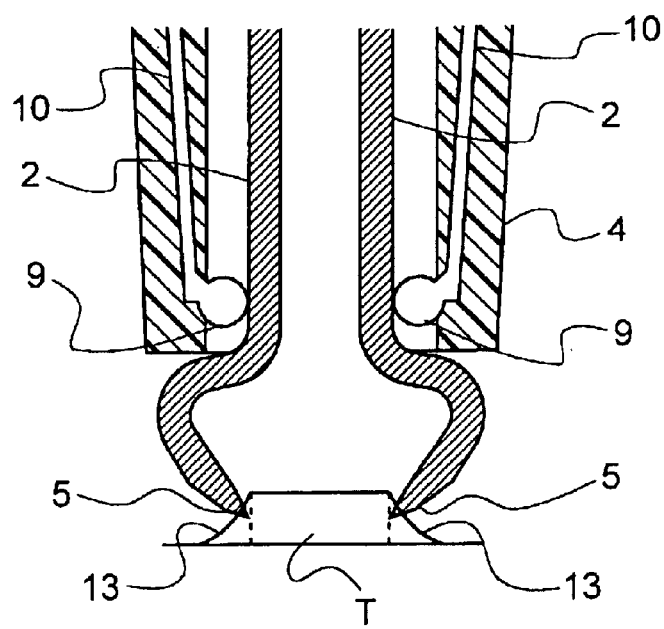
FIG. 5 is an enlarged partial cross-sectional view showing a state where the electric signal taking-out device is mounted to opposite ends of a chip part.

When the distal ends 5 of the contact elements 2 are placed to correspond to opposite ends of a chip part T from which electric signals are to be taken out and then the holding member 4 is forcibly moved toward the lowermost position, the contact elements 2, as shown in FIG. 5, are pushed by the fixed pins 9 so that the distal ends 5 are brought into contact with solder joints 13 by which the chip part T is soldered to the circuit board. Thereafter, when the holding member 4 is moved further downward, the distal ends 5 of the contact elements 2 are pressed against the solder joints 13, so that the sharp distal ends 5 of the contact elements 2 bite into the solder joints portions 13. Though force to press the holding member 4 is released in this state, the holding member 4 is held in place on the holder 3 by the brake pieces 12, whereby the distal ends 5 of the contact elements 2 are elastically held to the opposite ends of the chip part T. Electric signals are taken out from the circuit board via the solder joints 13, the contact elements 2, the fixed pins 9, the electric conductors 10 and the electrically conductive leads 11, to thereby be taken into the measuring apparatus.

Figure 6A:
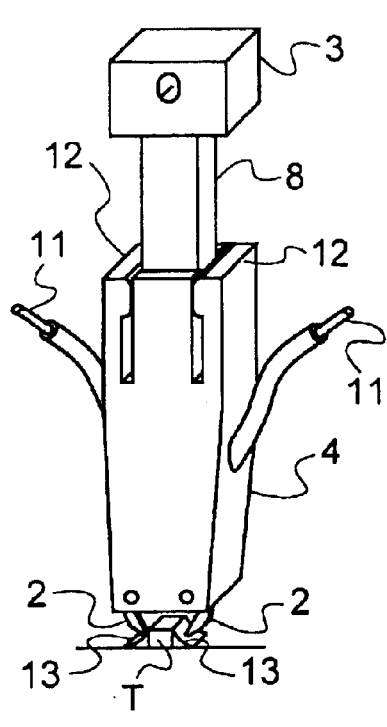
Figure 6B:
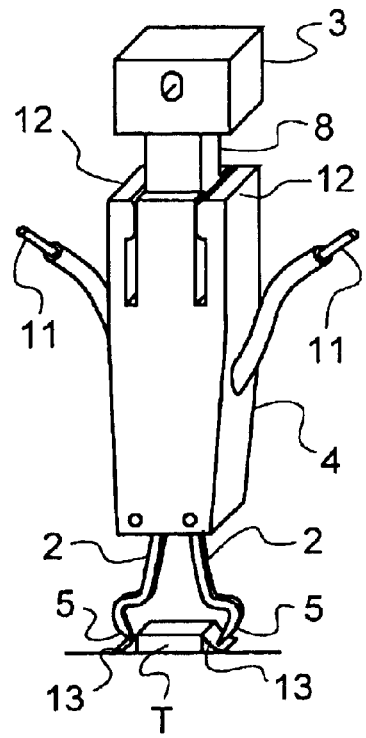
Figure 6C:
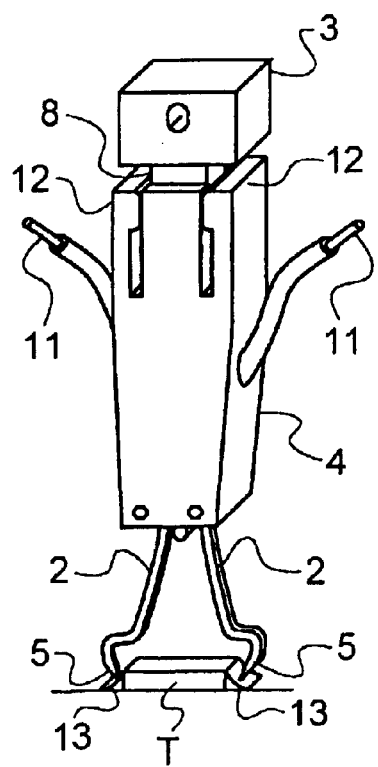

As shown in FIG. 6A, in the case of a chip part T of the minimum size, the holding member 4 is moved near the lowermost position so that the distal ends 5 of the contact elements 2 can be mounted to the solder joints 13 on the opposite ends of the chip part T in a state where the spacing between the distal ends 5 of the contact elements is small. As shown in FIG. 6B, in the case of a chip part T of medium size, the distal ends 5 of the contact elements 2 can be mounted to the solder joints 13 in a state where the holding member 4 is moved to an intermediate position. Further, in the case of a chip part T of the maximum size, as shown in FIG. 6C, the contact elements 2 can be mounted to the opposite ends of the chip part T in a state where the holding member 4 is slightly lowered from the uppermost position, so that independent electric signals can be taken out from the contact elements 2, i.e, the opposite ends of the chip part T, respectively. In each of the above cases, since the distal ends 5 of the contact elements 2 are maintained in a state where they are biting into the solder joints 13 due to the elasticity of the contact elements 2, the user's hand can be taken off the electric signal taking-out device 1. As a result, electric signals from a number of places on the circuit board can be supplied to the measuring apparatus for a long period of time.

An electric signal taking-out device according to another embodiment of the present invention will be explained below with reference to FIGS. 7A to 7C. In the electric signal taking-out device 20 of this embodiment, a compression spring 21 is interposed between a support member or holder 3 and a holding member 4 so as to bias the holding member 4 in a direction toward distal ends 5 of the contact elements 2. A spring force of the compression spring 21 shifts the distal ends 5 of the contact elements 2 inward via the holding member 4. In this embodiment, electrically conductive leads 22 are connected with the upper ends of the contact elements 2 which have proximal portions 6 formed integrally with the holder 3 by insert molding, so that electric signals ate taken out from an upper end portion of the holder 3.

Figure 7A:
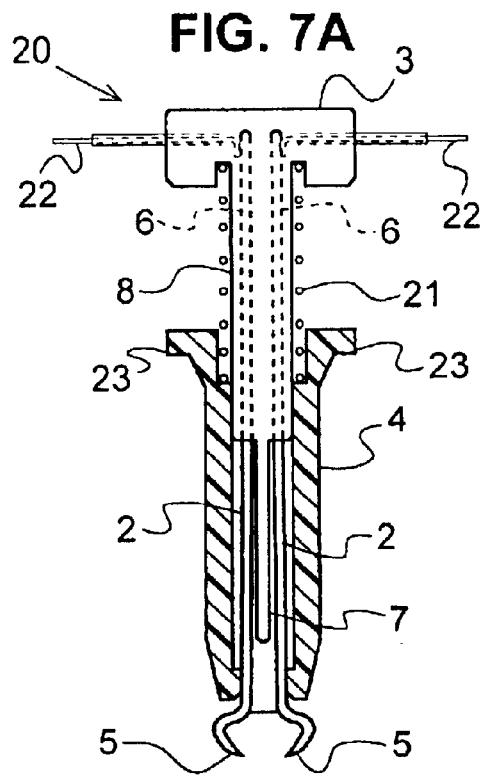
Figure 7B:
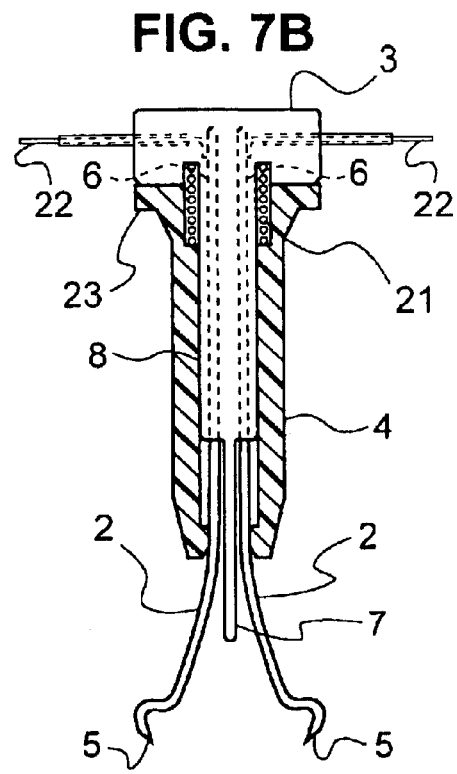

As shown in FIG. 7A, normally the holding member 4 is located at the lowermost position with respect to the holder 3 by the spring force of the compression spring 21, so that the contact elements 2 come in contact with a lower inner edge of the holding member 4, whereby the contact elements 2 are shifted so that a spacing between the distal ends 5 thereof becomes small. In the case where the device is mounted to a chip part T, the user's fingers are placed on protrusions 23 formed on an upper end of the holding member 4, and then the holding member 4 is moved in a direction toward the uppermost position against the spring force of the compression spring 21, resulting in the distal ends 5 of the contact elements 2 being spread out due to the elastic force of the contact elements 2 so that the spacing between the distal ends 5 becomes larger, as shown in FIG. 7B.

Figure 7C:
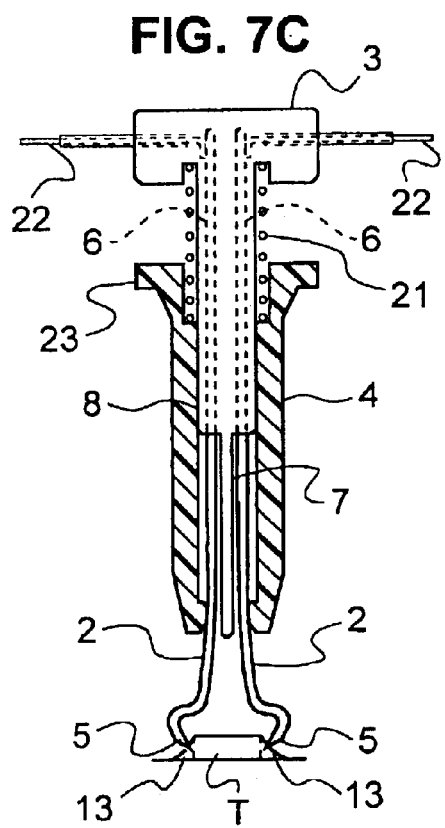

When the opposed distal ends 5 of the contact elements 2 are located on the opposite ends of the chip part T and the user's hand is taken off the holding member 4, the holding member 4 is moved toward the distal ends 5 of the contact elements 2 by the elastic force of the compression spring 21, as shown in FIG. 7C. As a result, the contact elements 2 abut against the lower inner edge of the holding member 4 so as to be shifted inward, and the distal ends 5 thereof bite into solder joints 13 of the chip part T so as to be held. Since the holding member 4 is urged downward by the spring force of the compression spring 21, an inward force always acts upon the contact elements 2, resulting in the contact elements 2 being securely held in place by the inward force.

According to the present invention, the contact elements, which include the sharp distal ends and are bent in an obliquely inward direction, are provided so that the sharp distal ends thereof face each other, wherein the contact elements are shifted inward and the distal ends thereof bite into the solder joints by which the chip part is soldered to the circuit board, and the biting state is maintained so that electric signals are taken out independently from the respective contact elements. For this reason, it is not necessary to hold the device with the user's hand during measurement and to previously solder metal chips or the like for measurement to the circuit board, so that electric signals for measurement can be taken out easily from opposite ends of an arbitrary chip part soldered to the circuit board.

What is claimed is:

1. An electric signal read-out method, comprising:
providing a pair of contact elements which include sharp distal ends and are bent obliquely inward so as to be opposite to each other so that said sharp distal ends face each other, the pair of contact elements being affixed to a holding member;
sliding the holding member between a first position and a second position, the first position having a first spacing between the sharp distal ends of the pair of contact elements, the second position having a second spacing between the sharp distal ends of the pair of contact elements that is smaller than the first spacing, and upon sliding the holding member to the second position, shifting said pair of contact elements inward so as to make said sharp distal ends thereof bite into solder joints by which a chip part is soldered to a circuit board; and
holding said pair of contact elements securely in a biting state, to thereby read out electric signals independently from said pair of contact elements.

2. An electric signal read-out device, comprising:
a pair of contact elements made of an electrically conductive material, each including a distal end portion which is bent obliquely inward and which has a sharp distal end, said pair of contact elements being arranged in such a manner as to be electrically insulated from each other and to be opposite each other while said sharp distal ends thereof face each other;
a supporting member having said pair of contact elements mounted thereto and provided with a guide section; and
a holding member for drawing said pair of contact elements toward each other so as to press said distal ends of said contact elements onto an object soldered to a circuit broad to be measured, to thereby make said distal ends of said contact elements bite into solder joints by which the object is soldered to the circuit board, and securely holding said pair of contact elements in a state where said distal ends of said pair of contact elements are biting into the solder joints, said holding member being slidably fitted on said guide section of said supporting member so as to be moved between a first position and a second position;

whereby when said holding member is located in said first position, a first spacing is provided between said distal ends of said pair of contact elements, and when said holding member is located in said second position, a second spacing is provided between said distal ends of said pair of contact elements that is smaller than the first spacing.

3. The electric signal read-out device according to claim 2, wherein said holding member is provided with a brake piece which is elastically engaged with said guide section of said supporting member so as to keep said holding member stopped at an arbitrary position with respect to said supporting member.

4. The electric signal read-out device according to claim 2, wherein said holding member has electric conductors led out to the outside and is provided on a distal end thereof with a pair of fixed pins which are formed of an electrically conductive material and which come in contact with outside surfaces of said pair of contact elements so as to shift said pair of contact elements inward, said fixed pins being connected with said electric conductors, respectively.

5. The electric signal read-out device according to claim 2, further comprising a spring, disposed between said supporting member and said holding member, for biasing said holding member toward said second position.

6. The electric signal read-out device according to claim 5, wherein said pair of contact elements include proximal portions which are formed integrally with said supporting member, and said supporting member has electrically conductive leads led out to the outside and connected with ends of said proximal portions of said contact elements, respectively.

7. The electric signal read-out device according to claim 2, wherein said supporting member includes an isolation piece extending between said pair of contact elements toward said distal ends of said contact elements so as to prevent said pair of contact elements from coming into contact with each other.

* * * * *